(12) United States Patent
Liao et al.

(10) Patent No.: US 10,595,411 B2
(45) Date of Patent: Mar. 17, 2020

(54) METHOD FOR MANUFACTURING CHIP SIGNAL ELEMENTS

(71) Applicant: Power Wave Electronic Co., Ltd., Taipei (TW)

(72) Inventors: Wen-Jiao Liao, Taipei (TW); Wei-Hong Tsai, Taipei (TW)

(73) Assignee: POWER WAVE ELECTRONICS CO., LTD., Taipei (TW)

( * ) Notice: Subject to any disclaimer, the term of this patent is extended or adjusted under 35 U.S.C. 154(b) by 361 days.

(21) Appl. No.: 15/586,264

(22) Filed: May 10, 2017

(65) Prior Publication Data
US 2018/0331417 A1    Nov. 15, 2018

(51) Int. Cl.
| | |
|---|---|
| H05K 1/16 | (2006.01) |
| H05K 3/00 | (2006.01) |
| H05K 3/42 | (2006.01) |
| H05K 1/09 | (2006.01) |
| H05K 3/06 | (2006.01) |
| H05K 3/28 | (2006.01) |
| H01Q 1/24 | (2006.01) |
| H01Q 1/22 | (2006.01) |

(Continued)

(52) U.S. Cl.
CPC .............. *H05K 1/165* (2013.01); *C25D 5/10* (2013.01); *C25D 7/12* (2013.01); *H01Q 1/2283* (2013.01); *H01Q 1/243* (2013.01); *H01Q 1/38* (2013.01); *H05K 1/09* (2013.01); *H05K 3/0047* (2013.01); *H05K 3/0052* (2013.01); *H05K 3/06* (2013.01); *H05K 3/28* (2013.01); *H05K 3/42* (2013.01); *H01Q 9/42* (2013.01); *H05K 2201/10098* (2013.01)

(58) Field of Classification Search
CPC ...... H05K 3/0047; H05K 3/0052; H05K 3/06; H05K 3/28; H05K 3/42; H05K 1/165; C25D 5/10; H01Q 1/2283; H01Q 1/243; H01Q 1/38
See application file for complete search history.

(56) References Cited

U.S. PATENT DOCUMENTS

| | | | | |
|---|---|---|---|---|
| 5,849,355 A | * | 12/1998 | McHenry | .............. H01F 41/042 |
| | | | | 427/79 |
| 7,251,120 B2 | * | 7/2007 | Takazawa | ........... H01F 17/0013 |
| | | | | 361/311 |

(Continued)

*Primary Examiner* — Peter Dungba Vo
*Assistant Examiner* — Jeffrey T Carley
(74) *Attorney, Agent, or Firm* — Chun-Ming Shih; HDLS IPR Services

(57) ABSTRACT

A method for manufacturing chip signal elements includes steps as follows. A substrate is provided. A plurality of through holes is drilled, and a plurality of side holes is formed along the through holes. A first cooper-plating process is performed to form a plurality of conductive layers electrically connected to the upper and the lower metal layer. A second cooper-plating process is performed to increase thickness of the conductive layers. A first and a second pattern layers are formed on the substrate by an etching. The first pattern layer is electrically connected to the second pattern layer to form a spiral radiator. An ink is printed on the substrate to cover the spiral radiator and form a solder mask layer. An organic metal process and a plating process are performed to form terminal electrodes. Finally, a single chip signal element having a spiral radiator is formed.

20 Claims, 12 Drawing Sheets

(51) Int. Cl.
  *H01Q 1/38* (2006.01)
  *C25D 7/12* (2006.01)
  *C25D 5/10* (2006.01)
  *H01Q 9/42* (2006.01)

(56) References Cited

U.S. PATENT DOCUMENTS

| | | | | |
|---|---|---|---|---|
| 8,598,034 B2* | 12/2013 | Park | ...................... | H01L 21/565 |
| | | | | 257/E23.038 |
| 2004/0034993 A1* | 2/2004 | Rybka | .................. | H01C 1/1406 |
| | | | | 29/623 |
| 2006/0097944 A1* | 5/2006 | McCarville | ............ | H01Q 1/286 |
| | | | | 343/795 |
| 2011/0140979 A1* | 6/2011 | Dayan | ..................... | H01P 3/121 |
| | | | | 343/772 |
| 2013/0140370 A1* | 6/2013 | Finn | ................. | G06K 19/07769 |
| | | | | 235/492 |
| 2014/0313005 A1* | 10/2014 | Bang | ..................... | H01F 41/041 |
| | | | | 336/200 |
| 2017/0208695 A1* | 7/2017 | Brigham | ................ | H05K 1/116 |
| 2018/0279466 A1* | 9/2018 | Shiozaki | ................... | H05K 3/42 |
| 2018/0324960 A1* | 11/2018 | Lee | ........................ | H05K 1/165 |

\* cited by examiner

METHOD FOR MANUFACTURING CHIP SIGNAL ELEMENTS

BACKGROUND

Technical Field

The present invention relates generally to an antenna, and more particularly to a method for manufacturing chip signal elements of receiving and transmitting signals.

Description of Related Art

With the development of wireless communication technologies, electronic products such as notebook computers, mobile phones, personal digital assistants (PDA) and other portable electronic devices are designed toward the trends of lightness and thinness. Therefore, the size of the antenna for transmitting and receiving radio signal is relatively reduced, or the structure thereof needs to be changed so that the antenna can be built inside the electronic product.

Currently, the common multi-band antenna includes a chip antenna and a carrier board. In manufacturing the chip antenna, a square substrate made of ceramic material is first prepared. Further, a radiator is manufactured on a surface of the substrate by a printing technology, a lithography process technology, or a wet etching technology. When the chip antenna is electrically connected on the carrier board, the radiator of the chip antenna is electrically connected to microstrip lines on the carrier board. After the microstrip lines are electrically connected to a coaxial cable, the signals received by a metal radiating portion are transmitted to the coaxial cable through the microstrip lines and then transmitted to a main board in the electronic device through the coaxial cable, thus implementing signal communication of the antenna.

Since the radiator of the chip antenna is manufactured by the printing technology, the lithography process technology, or the wet etching technology, the size of the chip antenna is much smaller than that of the conventional antenna. However, the volume of the carrier board is several times larger than that of the chip antenna such that the carrier board has better matching characteristics with the chip antenna. Therefore, the volume of the carrier board cannot be reduced once the size of the chip antenna cannot be reduced, thus being unsuitable for small-sized mobile electronic devices.

SUMMARY

It is an object of the present invention to provide a method for manufacturing chip signal elements. A dry etching technology or a wet etching technology is used to form a radiator covered on the chip signal element so that the size of the chip signal element is reduced and the volume of a carrier board matched with chip signal element is also reduced, thus being suitable for small-sized mobile electronic devices.

Accordingly, the present invention provides a method for manufacturing chip signal elements, and the method includes steps as follows. First, a substrate with a top surface and a bottom surface is provided, wherein an upper metal layer is disposed on the top surface and a lower metal layer is disposed on the bottom surface. Afterward, a plurality of through holes is drilled in a region of each chip signal element, wherein the through holes are correspondingly arranged. Afterward, a first cooper-plating process is performed on hole walls of the through holes to form a plurality of first conductive layers; wherein the first conductive layers are electrically connected to the upper metal layer and the lower metal layer. Afterward, a second cooper-plating process is performed on surfaces of the first conductive layers to correspondingly form a plurality of second conductive layers; wherein the first conductive layers and the second conductive layers form a plurality of conductive layers. Afterward, a first pattern layer is formed on the upper metal layer and forming a second pattern layer on the lower metal layer by a wet etching or a dry etching, wherein the first pattern layers are electrically connected to the second pattern layers through the conductive layers to form a spiral radiator. Afterward, an ink is printed on the top surface and the bottom surface of the substrate to cover a part of the spiral radiator and form a solder mask layer, wherein two ends of the spiral radiator are exposed to the solder mask layer. Afterward, an organic metal process is performed to form a first metal layer with good flatness on the top surface and the bottom surface of two ends of the substrate, wherein the first metal layer is electrically connected to the exposed parts at two ends of the spiral radiator; and then a second metal layer is plated on a surface of the first metal layer to form terminal electrodes of the chip signal elements. Afterward, the chip signal elements arranged in rows on the substrate are cut to form a plurality of single chip signal elements having a spiral radiator.

In one embodiment, side holes are formed along two sides of each row of the chip signal elements.

In one embodiment, each of the side holes is strip-shaped or circular.

In one embodiment, a diameter of each through hole is 0.15 mm.

In one embodiment, a hole distance between two adjacent through holes is 0.20 mm.

In one embodiment, the first pattern layer is composed of a plurality of straight wires and a plurality of electrode wires, and the straight wires are electrically connected to the corresponding conductive layers of the through holes.

In one embodiment, the second pattern layer is composed of a plurality of oblique wires and a plurality of electrode portions, and the oblique wires are obliquely electrically connected to the corresponding conductive layers of the through holes.

In one embodiment, a line width of each oblique wire and a line width of each straight wire is 0.05 mm, and a wire distance between two adjacent oblique wires and a wire distance between two adjacent straight wires is 0.05 mm.

In one embodiment, the ink of the solder mask layer is a black ink, and the black ink is made of an insulation material.

In one embodiment, the first metal layer includes copper, nickel, and gold; the second metal layer includes tin and copper.

In one embodiment, a cutting error of cutting the chip signal elements is ±0.05 mm.

In one embodiment, a white ink is printed on a surface of the solder mask layer to form an identification pattern layer for identifying directions, wherein the identification pattern layer comprises text patterns, number patterns, or graph patters.

In one embodiment, the cutting lines are aligned along the through holes between two adjacent chip signal elements, and different specific distances are presented between the through holes and the cutting lines.

In one embodiment, the substrate is cut along lines, which are perpendicular to the cutting lines and aligned along centers of the corresponding side holes, so that a plurality of single chip signal elements having a spiral radiator are embedded in the substrate.

In one embodiment, the substrate is cut along cutting lines, each cutting line is aligned along the through holes of the single chip element, and the conductive layers are exposed to the substrate after the substrate is cut.

In one embodiment, the substrate is cut along lines, which are perpendicular to the cutting lines and aligned along centers of terminal electrodes between two adjacent rows of chip signal elements, so that a plurality of single chip signal elements having a spiral radiator are formed around the substrate.

In one embodiment, an enhanced hole is drilled in the region of forming electrode portions on the top surface and the bottom surface of the substrate.

In one embodiment, a first copper-plating process is performed on a hole wall of the enhanced hole to form a first enhanced conductive layer.

In one embodiment, a second copper-plating process is performed on a surface of the first enhanced conductive layer to form a second enhanced conductive layer; wherein the first enhanced conductive layer and the second enhanced conductive layer form an enhanced conductive layer.

In one embodiment, the enhanced conductive layer is electrically connected to the electrode portions formed on the top surface and the bottom surface of the substrate after the substrate is etched.

It is to be understood that both the foregoing general description and the following detailed description are exemplary, and are intended to provide further explanation of the present invention as claimed. Other advantages and features of the present invention will be apparent from the following description, drawings and claims.

BRIEF DESCRIPTION OF DRAWING

The present invention can be more fully understood by reading the following detailed description of the embodiment, with reference made to the accompanying drawings as follows.

DETAILED DESCRIPTION

Figure 1:
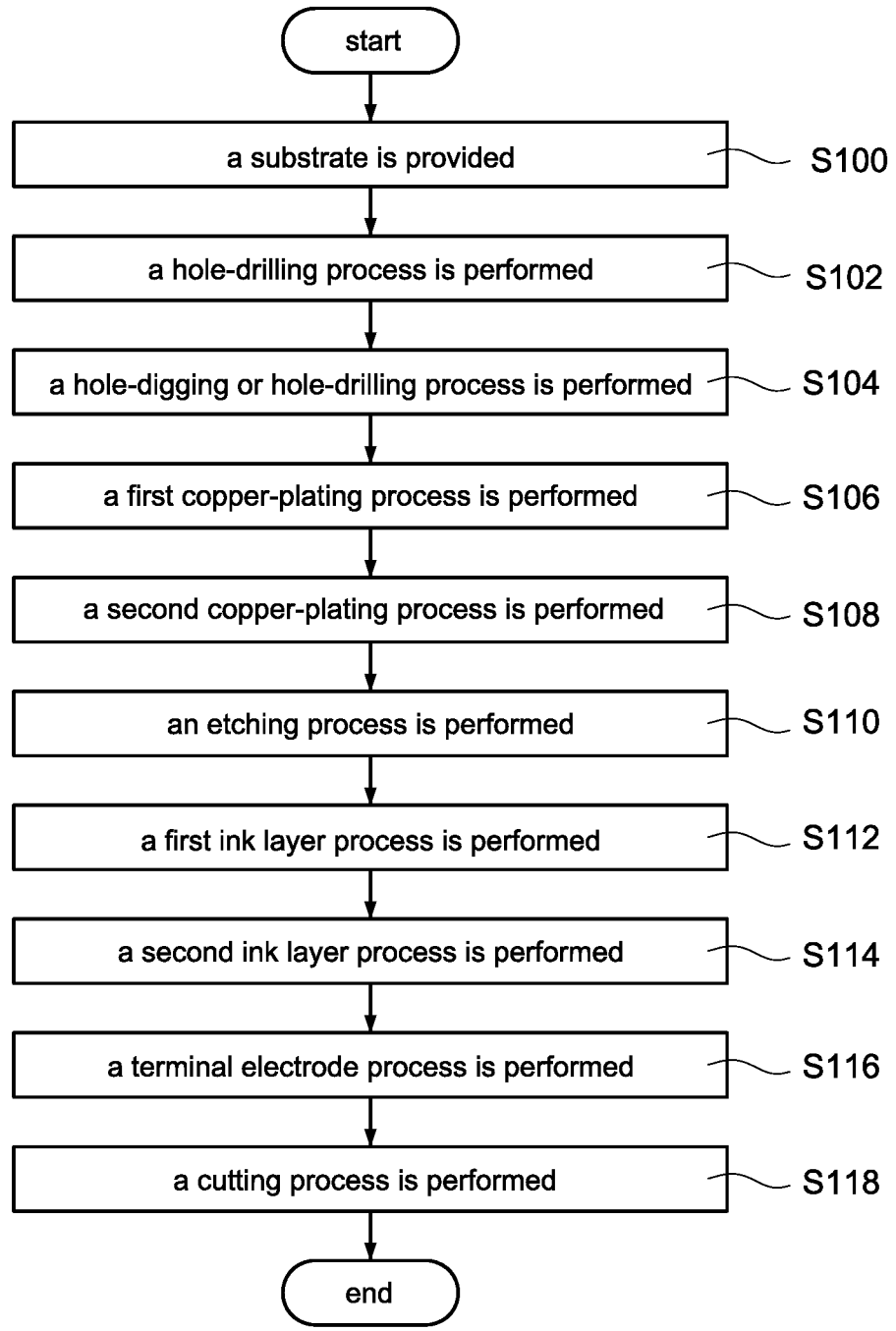
FIG. 1 shows a flowchart of a method of manufacturing a chip signal element according to a first embodiment of the present invention.

Reference will now be made to the drawing figures to describe the present invention in detail.

Figure 2:
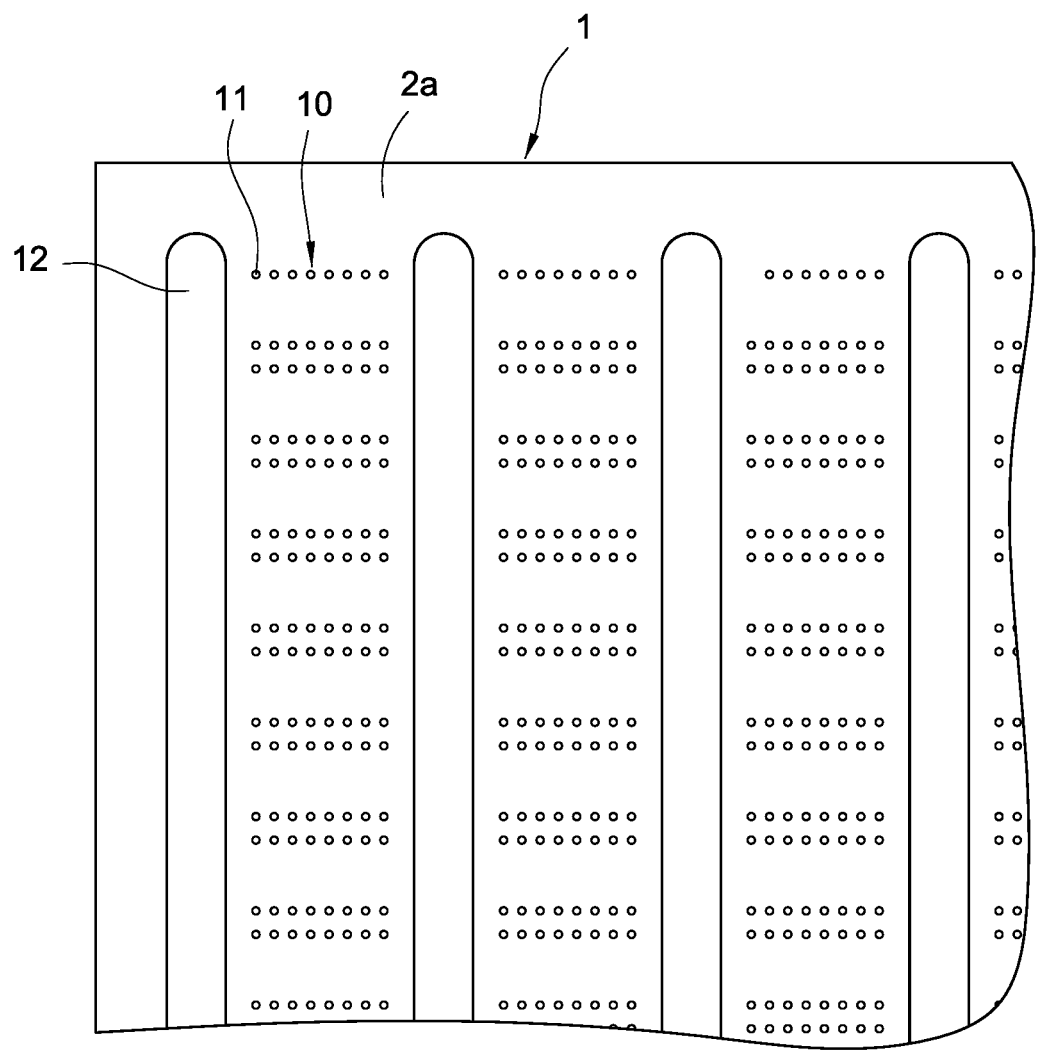
FIG. 2 shows a schematic view of a top surface of a substrate according to the first embodiment of the present invention.

Refer to FIG. 1, which shows a flowchart of a method of manufacturing a chip signal element according to a first embodiment of the present invention. Also, structural views of the chip signal element are shown from FIG. 2 to FIG. 10. As shown in FIG. 1, the method for manufacturing the chip signal element includes steps as follows. First, in step (S100), a substrate 1 is provided. The substrate 1 has a top surface and a bottom surface, and an upper metal layer 2a is disposed on the top surface and a lower metal layer 2b is disposed on the bottom surface shown in FIG. 2 and FIG. 3. In one example, the substrate 1 is a printed circuit board (PCB).

Afterward, in step (S102), a hole-drilling process for through holes is performed. A processing machine is used to drill a plurality of through holes 11 (also shown in FIG. 2), and the through holes 11 are correspondingly formed in a region of a single chip signal element 10 on the substrate 1. In this embodiment, a diameter of each through hole 11 is 0.15 mm, and a hole distance between two adjacent through holes 11 is 0.20 mm.

Afterward, in step (S104), a hole-digging process or a hole-drilling process for side holes is performed. After the through holes 11 are completed, a digging tool or drilling tool is used to dig or drill side holes 12 along two sides of each row of the chip signal elements 10. The side holes 12 are perpendicular to the through holes 11, and the side holes 12 and the through holes 11 are formed on the substrate 1 shown in FIG. 2. In this embodiment, each of the side holes 12 is strip-shaped and formed along two sides of the through holes 11.

Figure 3:
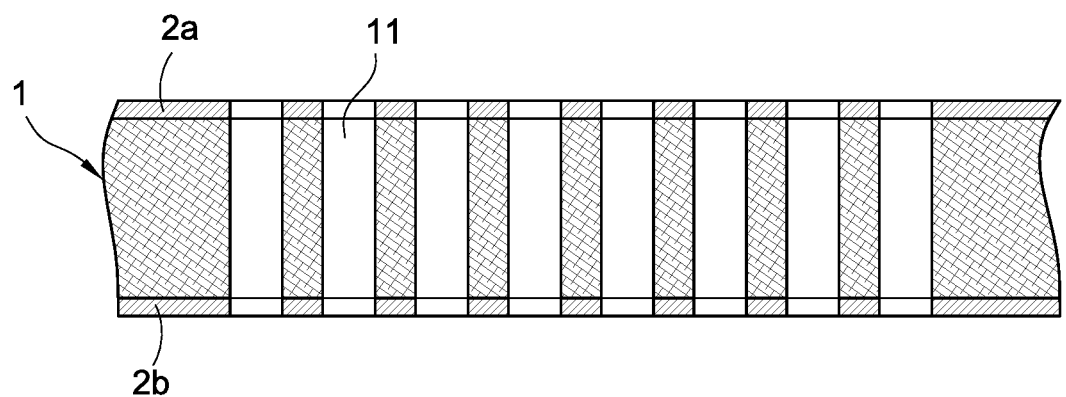
FIG. 3 shows a schematic side view of FIG. 2.
Figure 4:
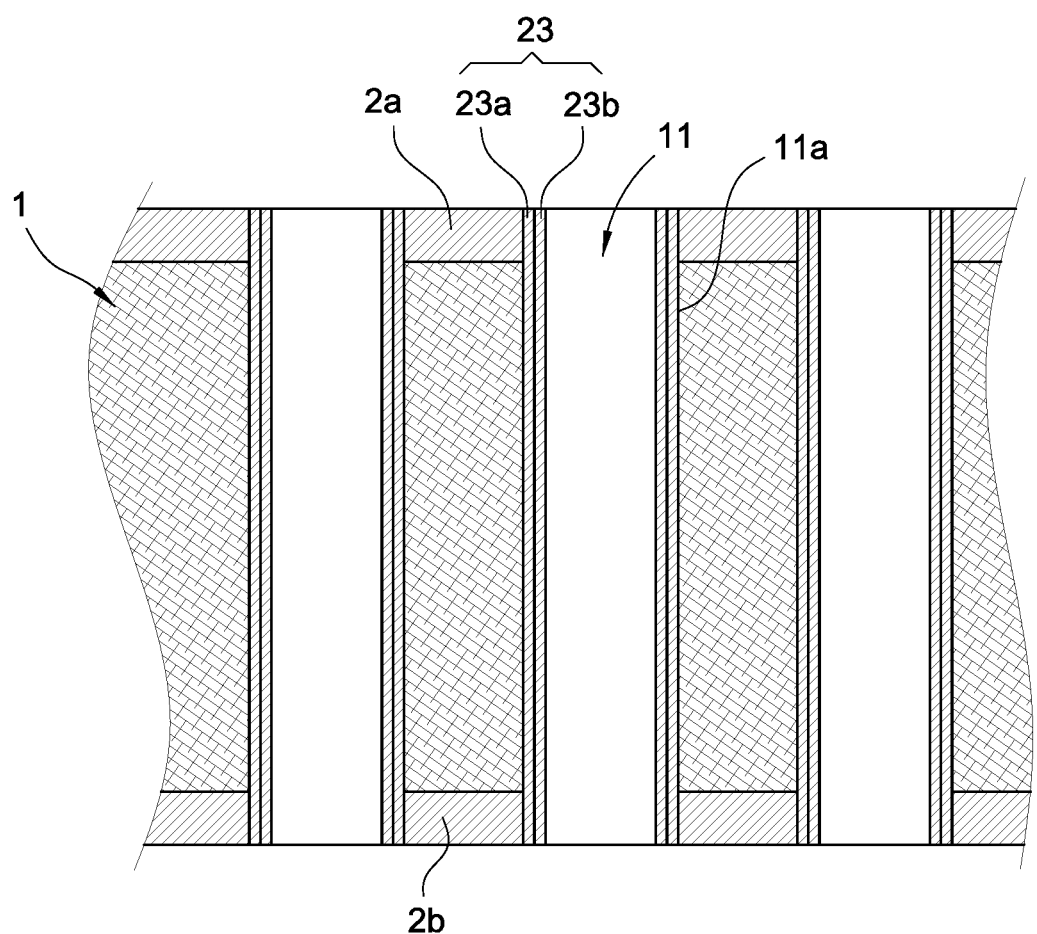
FIG. 4 shows a schematic view of manufacturing a conductive layer according to the first embodiment of the present invention.

Afterward, in step (S106), a first copper-plating process is performed. As shown in FIG. 3 and FIG. 4, sputtering or electroplating copper material is performed on hole walls 11a of the through holes 11 to form a plurality of first conductive layers 23a. The first conductive layers 23a are electrically connected to the corresponding upper metal layer 2a and lower metal layer 2b.

Afterward, in step (S108), a second copper-plating process is performed. As shown in FIG. 3 and FIG. 4, sputtering or electroplating copper material is performed again on the first conductive layers 23 to form a plurality of second conductive layers 23b, thus increasing the thickness of the conductive layers 23. The first conductive layer 23a and the second conductive layers 23b form a plurality of conductive layers 23.

Figure 5:
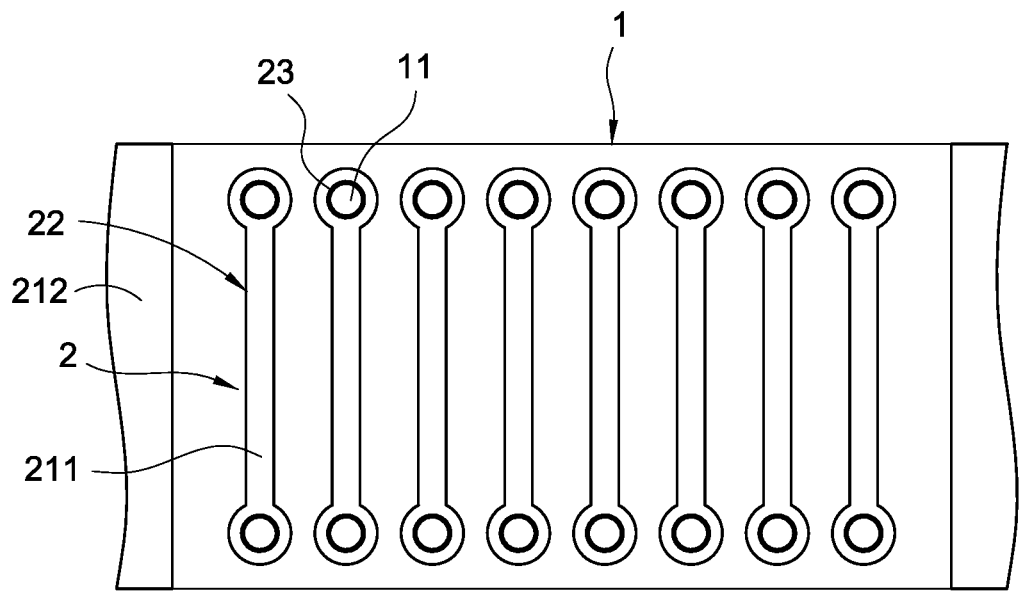
FIG. 5 shows a schematic view of etching an upper metal layer on the top surface of the substrate according to the first embodiment of the present invention.
Figure 6:
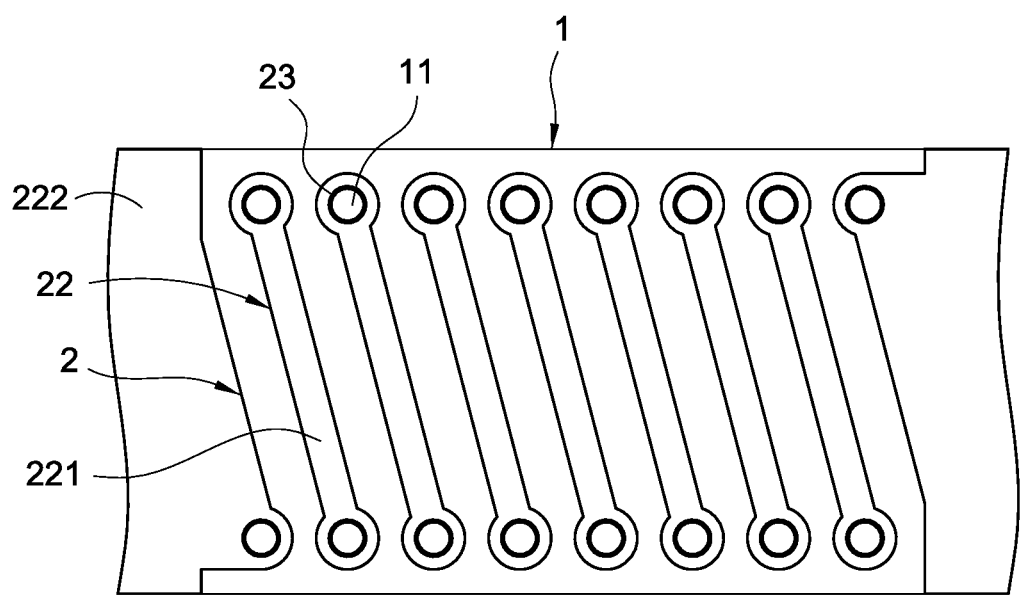
FIG. 6 shows a schematic view of etching a lower metal layer on the bottom surface of the substrate according to the first embodiment of the present invention.

Afterward, in step (S110), an etching process is performed. As shown in FIG. 5 and FIG. 6, a wet etching technology, such as chemical etching or a dry etching technology, such as laser direct imaging (LDI) is used to form a first pattern layer 21 on the upper metal layer 2a of the substrate 1. The first pattern layer 21 is composed of a plurality of straight wires 211 and a plurality of electrode wires 212, and the straight wires 211 are electrically connected to the corresponding through holes 11. Afterward, a laser beam is provided to form a second pattern layer 22 on the lower metal layer 2b of the substrate 1. The second pattern layer 22 is composed of a plurality of oblique wires 221 and a plurality of electrode portions 222, and the oblique wires 221 are obliquely electrically connected to the corresponding through holes 11 so that the first pattern layers 21 are electrically connected to the second pattern layers 22 through the conductive layers 23 to form a spiral radiator 2. In this embodiment, a line width of each oblique wire 221 and a line width of each straight wire 211 is 0.05 mm; and a wire distance between two adjacent oblique wires 221 and a wire distance between two adjacent straight wires 211 is 0.05 mm.

Figure 7:
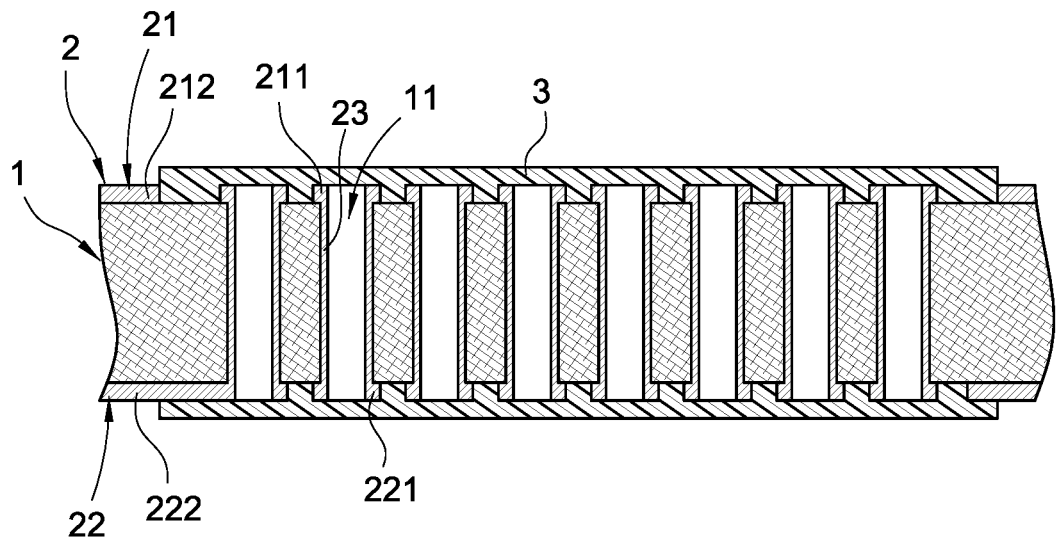
FIG. 7 shows a schematic side view of manufacturing a solder mask layer according to the first embodiment of the present invention.

Afterward, in step (S112), a first ink layer process is performed. After the radiator 2 is completed, a printing technology is used to print black ink on the top surface and bottom surface of the substrate 1 to cover spiral portions of the radiator 2 and form a solder mask layer 3, as shown in FIG. 7. Only a part of each electrode wire 212 at two ends of the radiator 2 and a part of each electrode wire 222 at two ends of the radiator 2 are exposed to the solder mask layer 3. In one example, the black ink is made of an insulation material.

Figure 8:
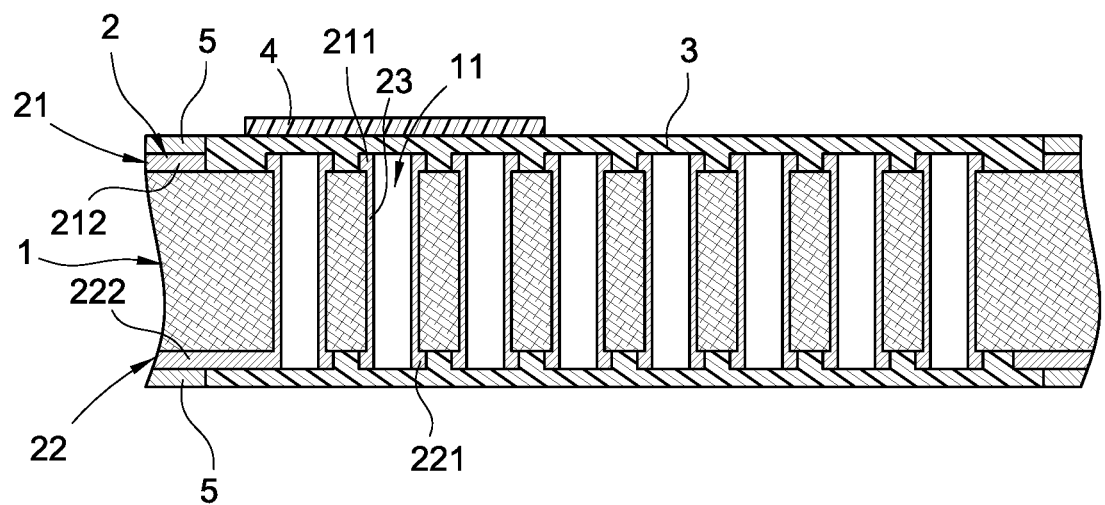
FIG. 8 shows a schematic side view of manufacturing an identification pattern layer according to the first embodiment of the present invention.

Afterward, in step (S114), a second ink layer process is performed. After the first ink layer is completed, the printing technology is used again to print a white ink on a surface of the solder mask layer 3 to form an identification pattern layer 4 for identifying directions, as shown in FIG. 8. In one example, the identification pattern layer 4 includes text patterns, number patterns, or graph patterns.

Afterward, in step (S116), a terminal electrode process is performed. After the identification pattern layer 4 is completed, an organic metal process is used to form a first metal layer with good flatness on the top surface and the bottom surface of two ends of the substrate 1. The first metal layer is electrically connected to the exposed parts of the electrode wires 212 and the exposed parts of the electrode portions 222 of the radiator 2. Afterward, a second metal layer is plated on a surface of the first metal layer to form terminal electrodes 5 of the chip signal elements 10, shown in FIG. 8 and FIG. 9. In one example, the first metal layer includes copper, nickel, and gold; and the second metal layer includes tin and copper.

Figure 9:
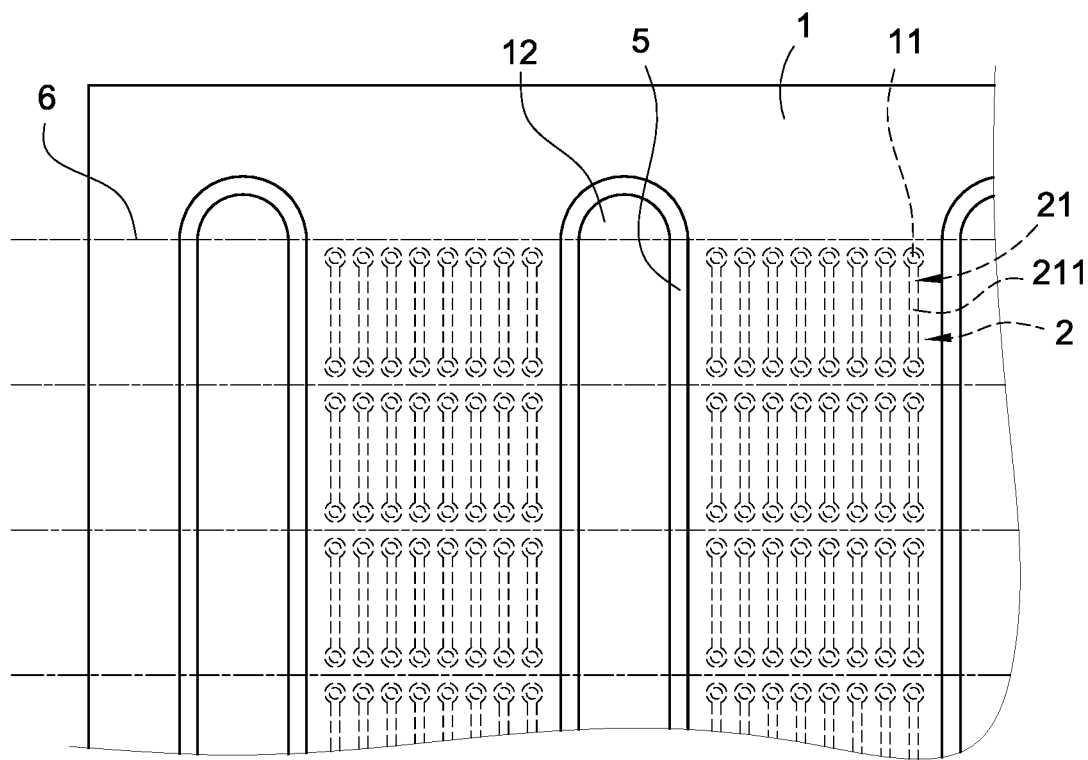
FIG. 9 shows a schematic view of manufacturing a terminal electrode according to the first embodiment of the present invention.
Figure 10:
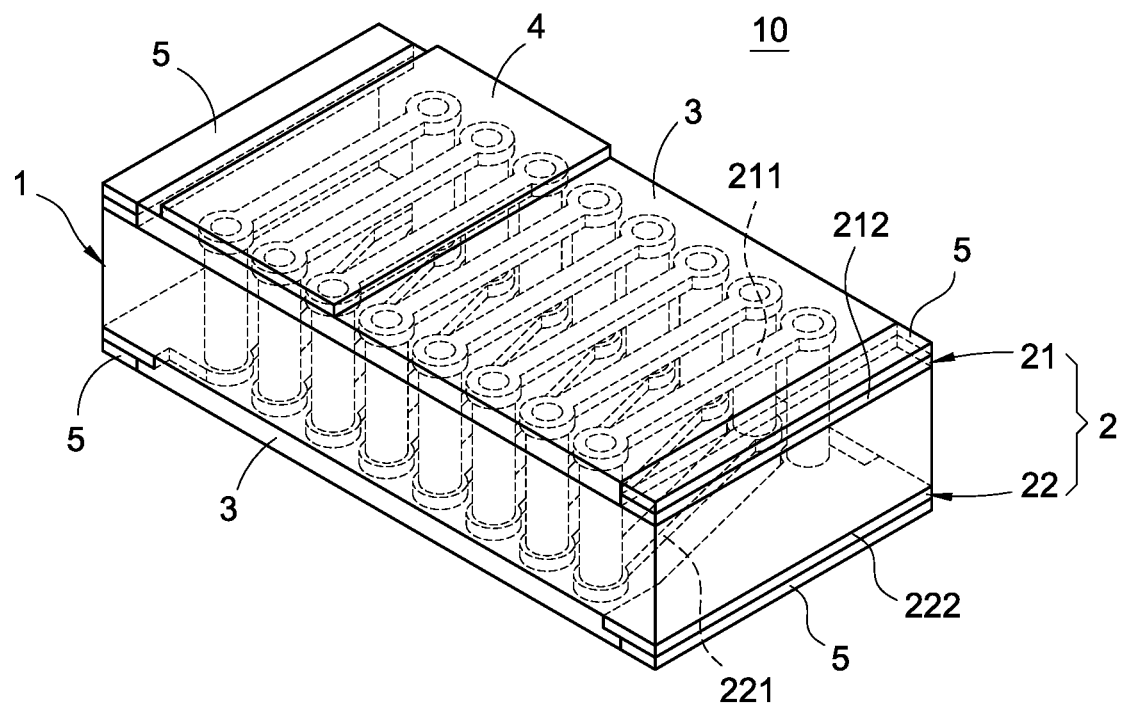
FIG. 10 shows a schematic perspective view of a single chip signal element according to the first embodiment of the present invention.

Afterward, in step (S118), a cutting process is performed. After the terminal electrodes 5 are completed, a cutting line 6 is provided between through holes 11 of two adjacent chip signal elements 10. As shown in FIG. 9, the substrate 1 is cut along the cutting line 6 by a cutting tool so that different specific distances are presented between the through holes 11 and the cutting lines 6 on the substrate 1. After the chip signal elements arranged in rows on the substrate are cut, a plurality of single chip signal elements 10 having a spiral radiator 2 are embedded in the substrate. In this embodiment, a cutting error is ±0.05 mm.

Figure 11:
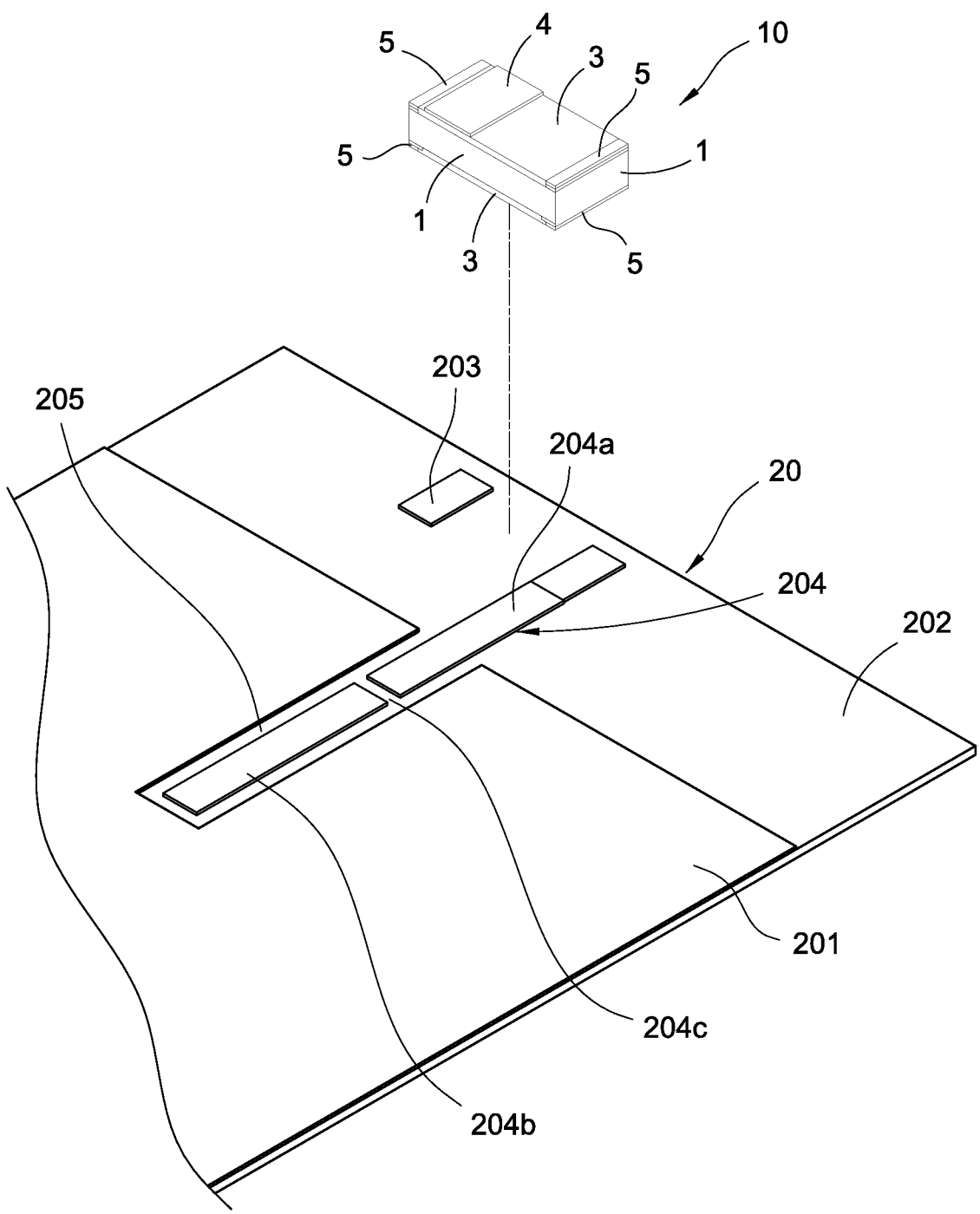
FIG. 11 shows a schematic view of a use condition between a carrier board and the chip signal element according to the first embodiment of the present invention.

Refer to FIG. 11, which shows a schematic view of use condition between a carrier board and the chip signal element according to the first embodiment of the present invention. After completely manufacturing the chip signal element 10, the chip signal element 10 is electrically connected on the carrier board 20. More specifically, in one embodiment, the chip signal element 10 is electrically connected on the carrier board 20 having a clearance area.

The carrier board 20 has a front surface and a back surface. The front surface of the carrier board 20 has a first grounding metal layer 201 and a bare empty portion 202. The bare empty portion 202 has a fixed end 203 and a signal feeding line 204 thereon. The signal feeding line 204 includes a first signal feeding line 204a, a second signal feeding line 204b, and a spacing 204c formed between the first signal feeding line 204a and the second signal feeding line 204b. The first signal feeding line 204a and the second signal feeding line 204b may be electrically connected to a gap 205 between thereof by a matching circuit (not shown) for impedance and frequency adjustments. The back surface of the carrier board 20 has a second grounding metal layer (not shown) and a clearance area (not shown).

When the chip signal element 10 is electrically connected on the carrier board 20, the terminal electrodes 5 of the chip signal element 10 are electrically connected to the fixed end 203 and one terminal of the first signal feeding line 204a. In addition, the other terminal of the second signal feeding line 204b is provided to electrically connect to a coaxial cable (not shown). When the antenna is used for receiving or transmitting signals, the received signals are delivered from the coaxial cable to the signal feeding line 204 and the transmitted signals are delivered from the signal feeding line 204 to the coaxial cable, thus implementing signal communication of the antenna.

Figure 12:
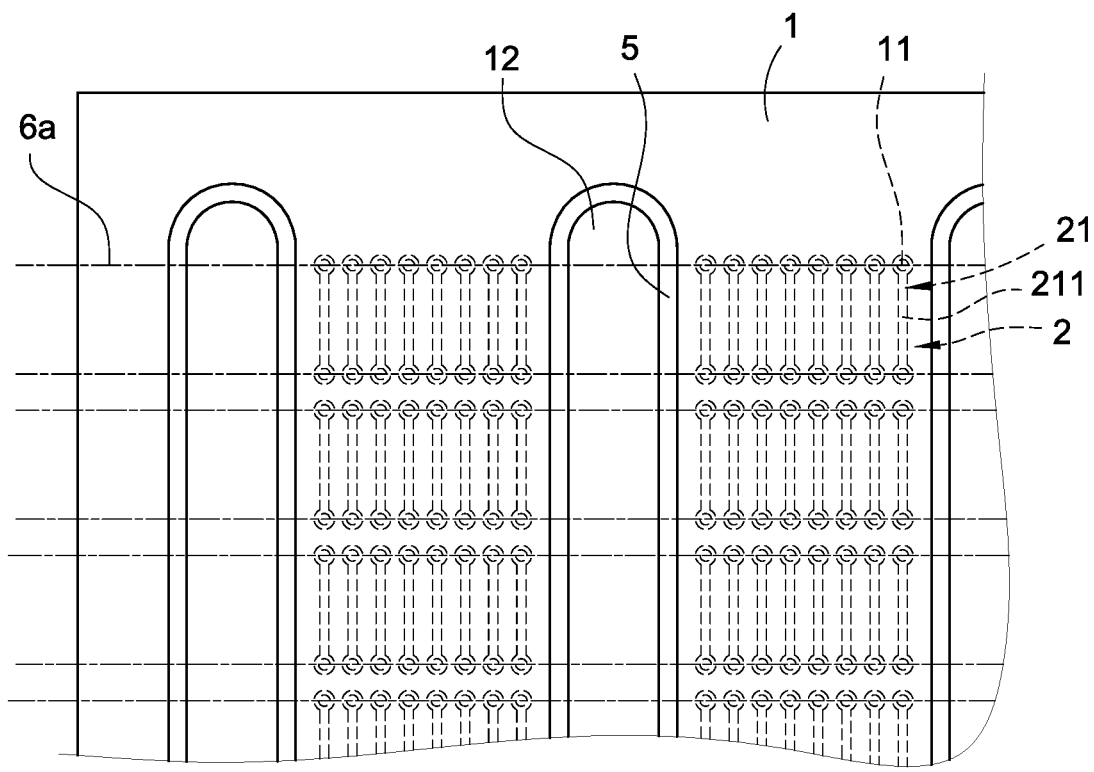
FIG. 12 shows a schematic view of cutting the chip signal element according to a second embodiment of the present invention.
Figure 13:
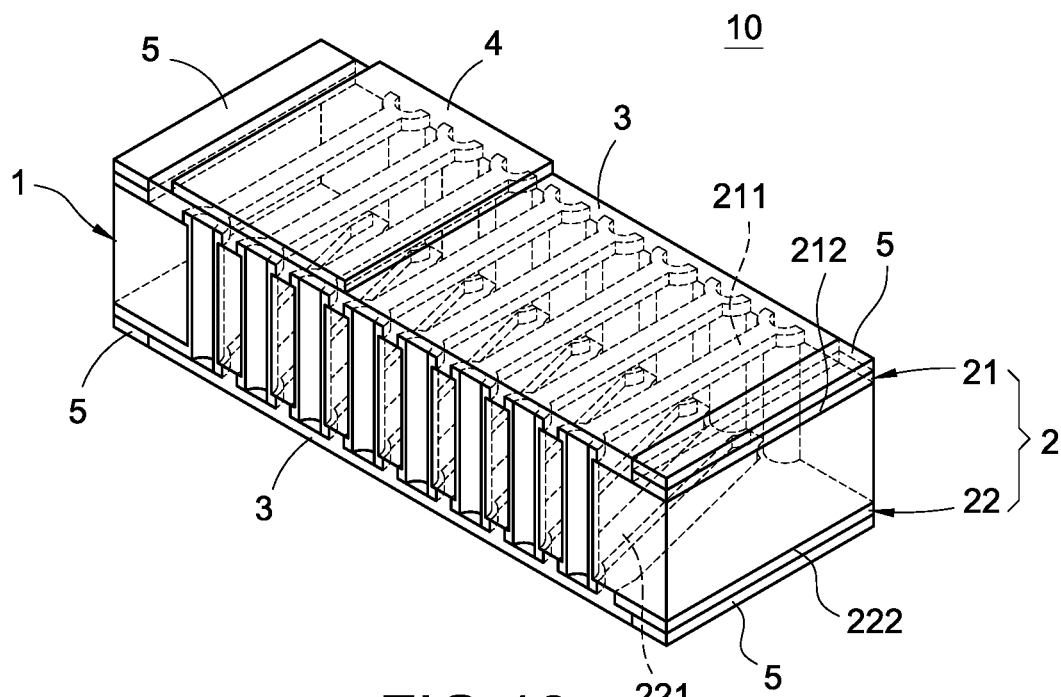
FIG. 13 shows a schematic perspective view of the chip signal element according to the second embodiment of the present invention.

Refer to FIG. 12 and FIG. 13, which show a schematic view of cutting the chip signal element and a schematic perspective view of the chip signal element according to a second embodiment of the present invention, respectively. A method of manufacturing a chip signal element 10a in the second embodiment is similar to that of manufacturing the chip signal element 10 in the first embodiment shown in FIG. 1 to FIG. 11. The major difference between the first embodiment and the second embodiment is that each of the cutting lines 6a is aligned along the through holes 11 in the second embodiment. After the substrate 1 is cut, the conductive layers 23 are exposed to the substrate 1 so as to form the chip signal elements 10a, and each of the chip signal elements 10a has spiral radiators 2 formed around the substrate 1. In this embodiment, a cutting error is ±0.05 mm.

Figure 14:
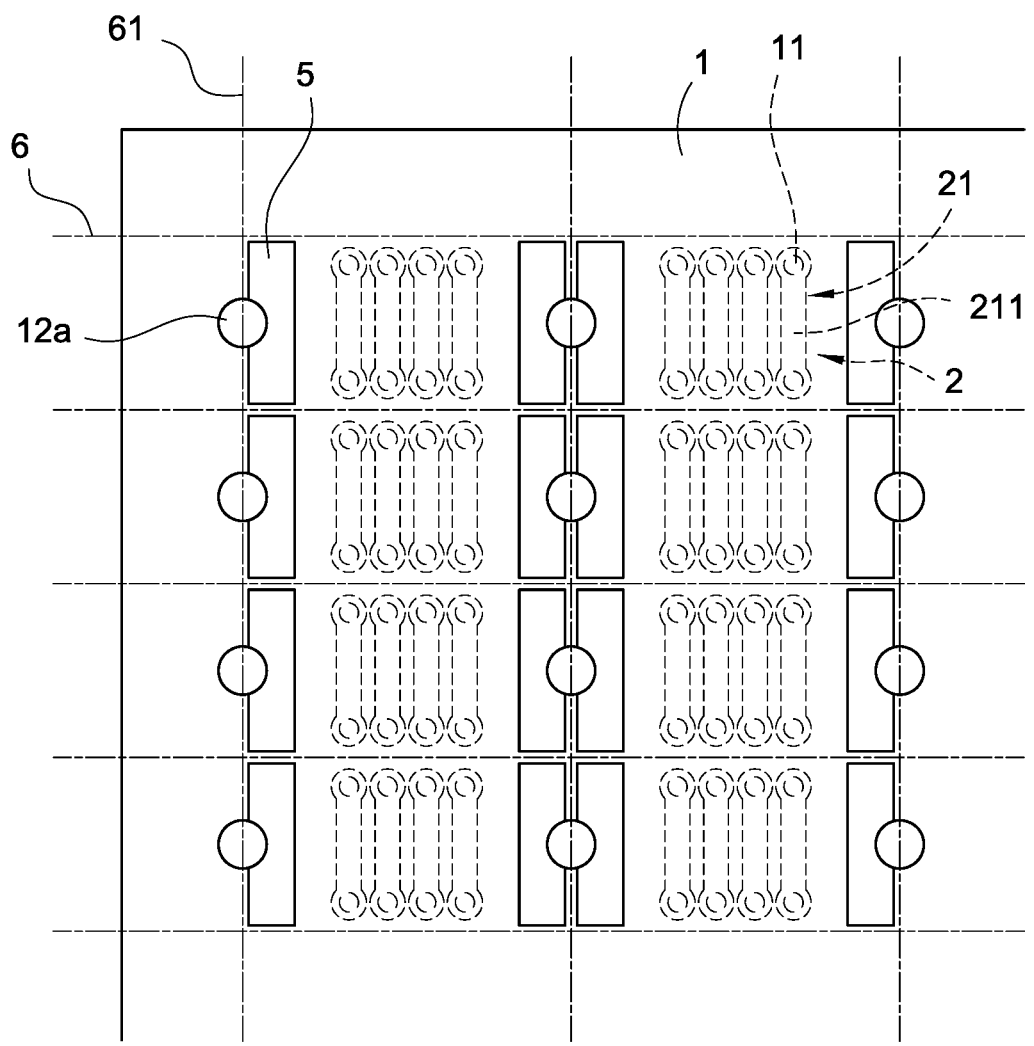
FIG. 14 shows a schematic view of a top surface of a substrate according to a third embodiment of the present invention.

Refer to FIG. 14, which shows a schematic view of a top surface of a substrate according to a third embodiment of the present invention. A method of manufacturing a chip signal element 10a in the third embodiment is similar to that of manufacturing the chip signal element 10 shown in the first embodiment shown in FIG. 1 to FIG. 11. The major difference between the first embodiment and the third embodiment is that each of the side holes 12a is circular and formed at two sides of each chip signal element 10 in the third embodiment. After the aforementioned wet or dry etching process, the side holes 12a are correspondingly formed on the electrode wires 212 and the electrode portions 222. In particular, the structure of circular side holes 12a can be also implemented in the second embodiment.

As shown in FIG. 14, the substrate 1 is cut along the cutting line 6 provided between through holes 11 of two adjacent chip signal elements 10 by the cutting tool so that different specific distances are presented between the through holes 11 and the cutting lines 6 on the substrate 1. Afterward, the substrate 1 is cut along cutting lines 61, which are perpendicular to the cutting lines 6 and aligned along centers of the corresponding side holes 12a, so that a plurality of single chip signal elements 10 having a spiral radiator 2 are acquired.

Figure 15:
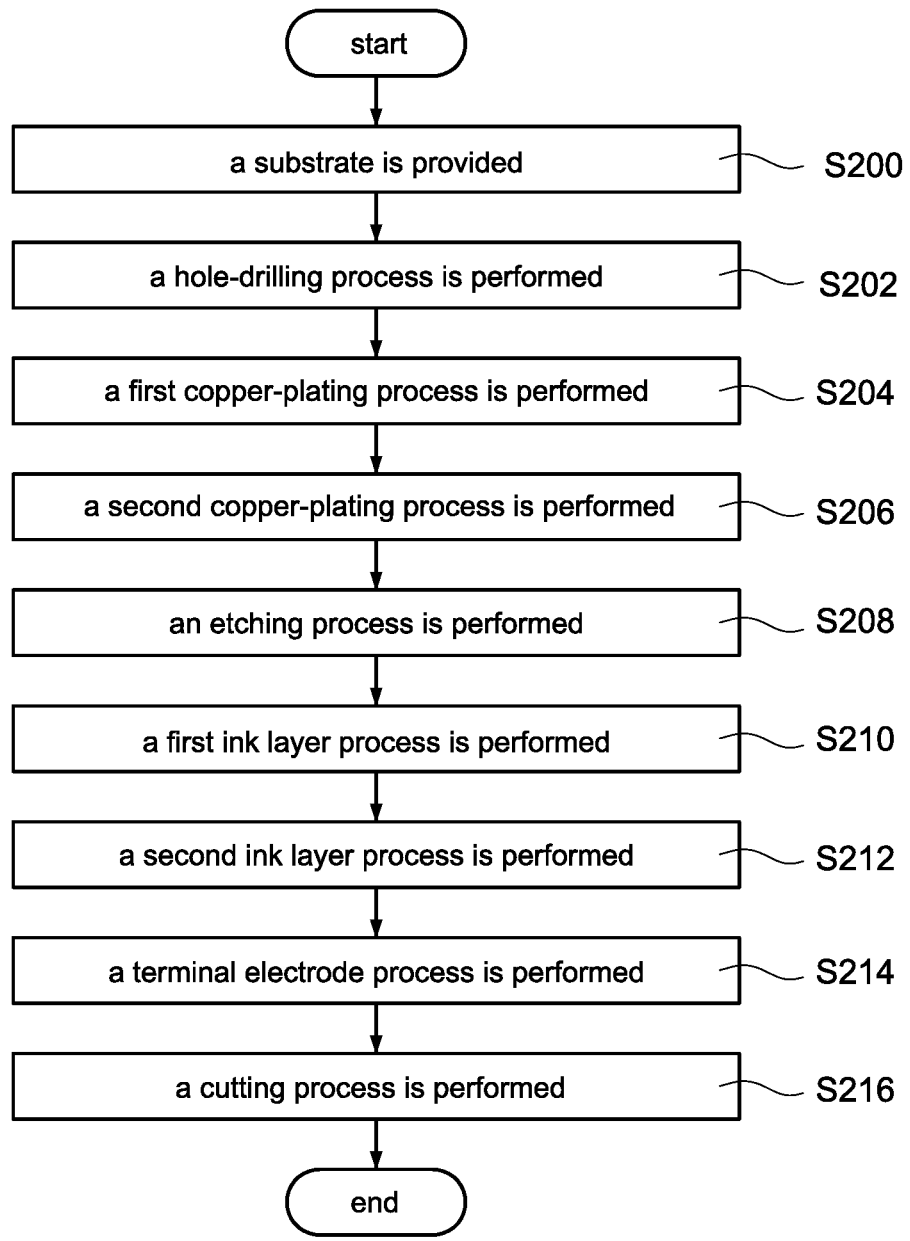
FIG. 15 shows is a flowchart of a method of manufacturing a chip signal element according to a fourth embodiment of the present invention.
Figure 16:
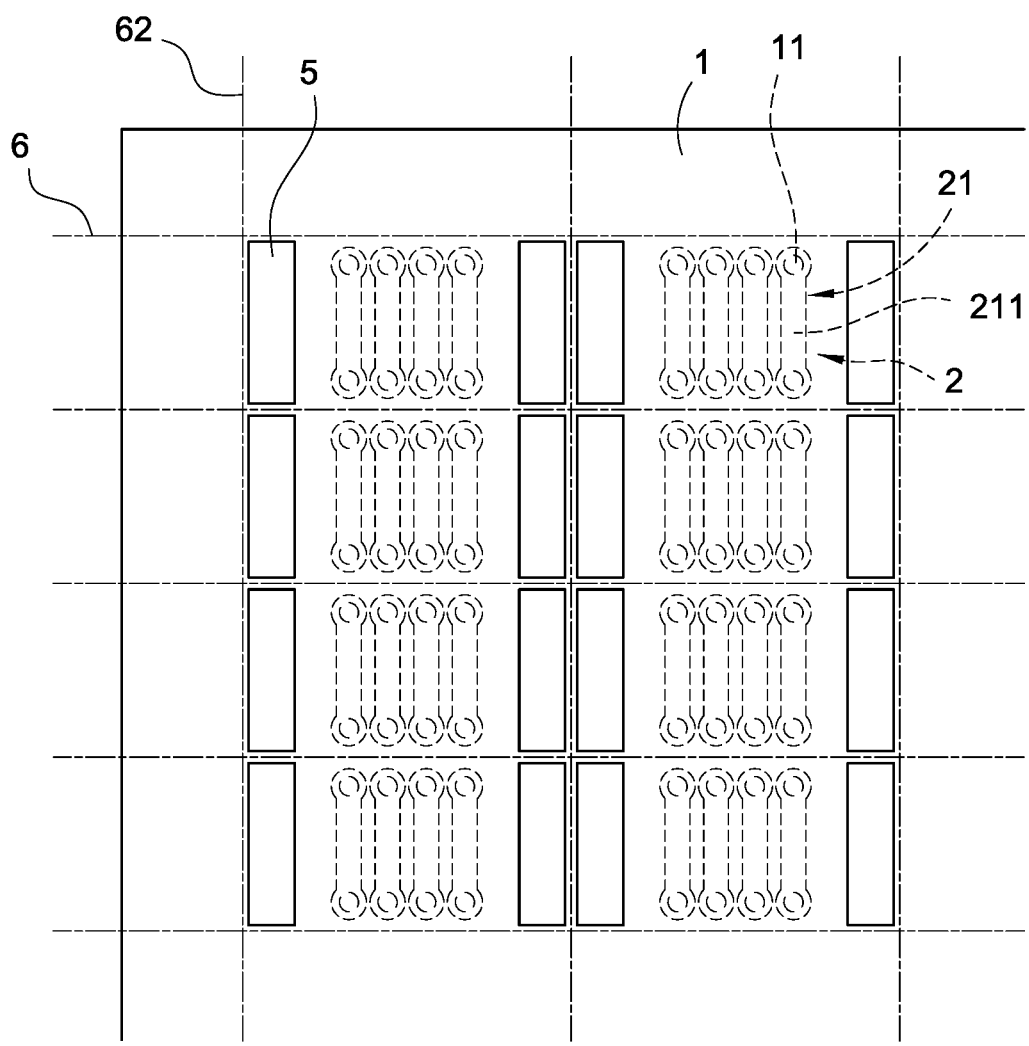
FIG. 16 shows a schematic view of a top surface of a substrate according to the fourth embodiment of the present invention.

Refer to FIG. 15 and FIG. 16, which show a flowchart of a method of manufacturing a chip signal element and a schematic view of a top surface of a substrate according to a fourth embodiment, respectively. The method of manufacturing the chip signal element in the fourth embodiment is similar to that of manufacturing the chip signal element in the first embodiment. The major difference between the first embodiment and the fourth embodiment is that the hole-digging process or the hole-drilling process for side holes (i.e., the step (S104) in the first embodiment) is omitted in the fourth embodiment. In other words, after the hole-drilling process for through holes (S202), the first copper-plating process (S204) is performed next.

As shown in FIG. 14, the substrate 1 is cut along the cutting line 6 provided between through holes 11 of two adjacent chip signal elements 10 by the cutting tool so that different specific distances are presented between the through holes 11 and the cutting lines 6 on the substrate 1. Afterward, the substrate 1 is cut along cutting lines 62, which are perpendicular to the cutting lines 6 and aligned along centers of terminal electrodes 5 between two adjacent rows of chip signal elements, so that a plurality of single chip signal elements 10 having a spiral radiator 2 are acquired. In particular, the structure without dug or drilled side holes 12, 12a can be also implemented in the second embodiment.

Figure 17:
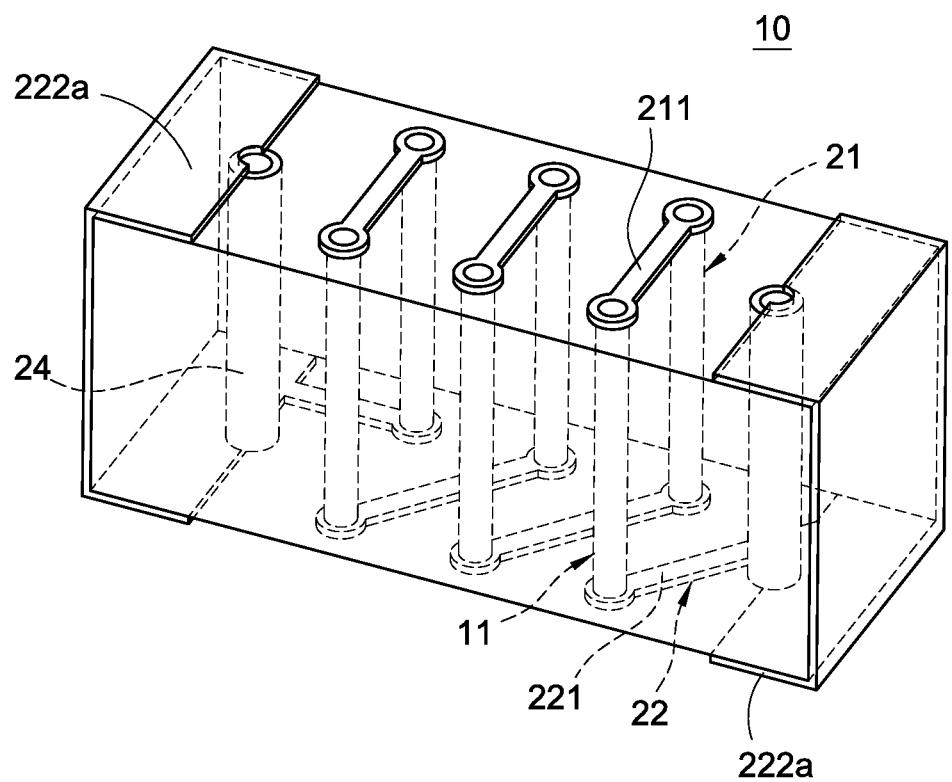
FIG. 17 shows a schematic view of a chip signal element according to a fifth embodiment of the present invention.
Figure 18:
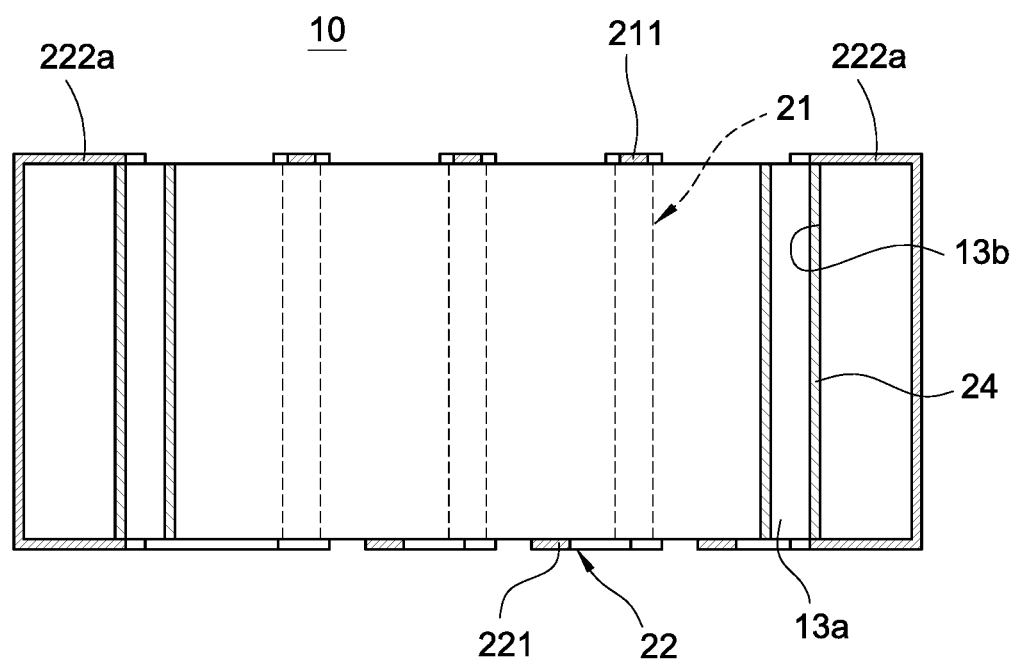
FIG. 18 shows a schematic side sectional view of FIG. 17.

Refer to FIG. 17 and FIG. 18, which show a schematic view of a chip signal element according to a fifth embodiment of the present invention and a schematic side sectional view of FIG. 17, respectively. The major difference between the first embodiment and the fifth embodiment is that an enhanced hole 13a is further drilled in the region of forming electrode portions 222a on the top surface and the bottom surface of the substrate 1 in the step (S102). Moreover, the first copper-plating process (S106) and the second copper-plating process (S108) are performed for processing a hole wall 13b of the enhanced hole 13a. In other words, a first enhanced conductive layer (not shown) is formed on the hole wall 13b of the enhanced hole 13a after the first copper-plating process (S106) and a second enhanced conductive layer (not shown) is formed on a surface of the first enhanced conductive layer after the second copper-plating process (S108). Therefore, an enhanced conductive layer 24 is composed of the first enhanced conductive layer and the second enhanced conductive layer, and the enhanced conductive layer 24 is electrically connected to the electrode portions 222 formed on the top surface and the bottom surface of the substrate 1 in the step (S110). Finally, the chip signal element 10 shown in FIG. 17 is completed after the steps (S112) to (S118) are performed.

The enhanced conductive layer 24 is provided to prevent the electrode portions 222a on the top surface and the bottom surface of the substrate 1 from falling apart when the chip signal element 10 is plated with tin by a soldering pot or is welded by a reflow oven, thus avoiding producing the chip signal elements 10 with poor conductivity.

Although the present invention has been described with reference to the preferred embodiment thereof, it will be understood that the present invention is not limited to the details thereof. Various substitutions and modifications have been suggested in the foregoing description, and others will occur to those of ordinary skill in the art. Therefore, all such substitutions and modifications are intended to be embraced within the scope of the present invention as defined in the appended claims.

What is claimed is:

1. A method for manufacturing chip signal elements, the method comprising steps of:
   (a) providing a substrate with a top surface and a bottom surface, wherein an upper metal layer is disposed on the top surface and a lower metal layer is disposed on the bottom surface;
   (b) drilling a plurality of through holes in a region of each each of the chip signal elements, wherein the chip signal elements are arranged in rows and wherein the through holes are correspondingly arranged;
   (c) performing a first cooper-plating process on hole walls of the through holes to form a plurality of first conductive layers; wherein the first conductive layers are electrically connected to the upper metal layer and the lower metal layer;
   (d) performing a second copper-plating process on surfaces of the first conductive layers to correspondingly form a plurality of second conductive layers; wherein the first conductive layers and the second conductive layers form a plurality of conductive layers;
   (e) forming a first pattern layer on the upper metal layer and forming a second pattern layer on the lower metal layer by a wet etching or a dry etching, wherein the first pattern layers are electrically connected to the second pattern layers through the plurality of conductive layers to form a spiral radiator;
   (f) printing an ink on the top surface and the bottom surface of the substrate to cover a part of the spiral radiator and form a solder mask layer, wherein two ends of the spiral radiator are exposed to the solder mask layer;
   (g) performing an organic metal process to form a first metal layer that is flat on the top surface and the bottom surface of two ends of the substrate, wherein the first metal layer is electrically connected to the exposed parts at two ends of the spiral radiator; and
   then plating a second metal layer on a surface of the first metal layer to form terminal electrodes of the chip signal elements; and
   (h) cutting the chip signal elements arranged in the rows on the substrate to form a plurality of single chip signal elements having a spiral radiator.

2. The manufacturing method in claim 1, further comprising step (b1) between the step (b) and the step (c):
   (b1) forming side holes along two sides of each row of the chip signal elements.

3. The manufacturing method in claim 2, wherein each of the side holes is strip-shaped or circular.

4. The manufacturing method in claim 2, wherein a diameter of each through hole is 0.15 mm.

5. The manufacturing method in claim 2, wherein a hole distance between two adjacent through holes is 0.20 mm.

6. The manufacturing method in claim 2, wherein the first pattern layer is composed of a plurality of straight wires and a plurality of electrode wires, and the straight wires are electrically connected to corresponding ones of the plurality of conductive layers of the through holes.

7. The manufacturing method in claim 6, wherein the second pattern layer is composed of a plurality of oblique wires and a plurality of electrode portions, and the oblique wires are obliquely electrically connected to corresponding ones of the plurality of conductive layers of the through holes.

8. The manufacturing method in claim 7, wherein a line width of each oblique wire and a line width of each straight wire is 0.05 mm, and a wire distance between two adjacent oblique wires and a wire distance between two adjacent straight wires is 0.05 mm.

9. The manufacturing method in claim 2, wherein the ink of the solder mask layer is a black ink, and the black ink is made of an insulation material.

10. The manufacturing method in claim 2, wherein the first metal layer includes copper, nickel, and gold; the second metal layer includes tin and copper.

11. The manufacturing method in claim 2, wherein a cutting error of cutting the chip signal elements is ±0.05 mm.

12. The manufacturing method in claim 2, further comprising step (f1) between the step (f) and the step (g):
(f1) printing a white ink on a surface of the solder mask layer to form an identification pattern layer for identifying directions, wherein the identification pattern layer comprises text patterns, number patterns, or graph patters.

13. The manufacturing method in claim 2, wherein the step (h) further comprises:
aligning cutting lines aligned along the through holes between two adjacent ones of the chip signal elements, wherein different specific distances are presented between the through holes and the cutting lines.

14. The manufacturing method in claim 13, wherein the step (h) further comprises:
cutting the substrate along lines, which are perpendicular to the cutting lines and aligned along centers of the corresponding side holes, to form a spiral radiator embedded in one of the chip signal elements on the substrate.

15. The manufacturing method in claim 2, wherein the step (h) further comprises:
cutting the substrate along cutting lines, aligning each cutting line along the through holes of the single chip element, and exposing the plurality of conductive layers formed on the through holes after the substrate is cut.

16. The manufacturing method in claim 15, wherein the step (h) further comprises:
cutting the substrate along lines, which are perpendicular to the cutting lines and aligned along centers of terminal electrodes between two adjacent chip signal elements within two different rows, so that a plurality of single chip signal elements having a spiral radiator are formed around the substrate.

17. The manufacturing method in claim 1, wherein the step (b) further comprises:
drilling an enhanced hole in the region of forming electrode portions on the top surface and the bottom surface of the substrate.

18. The manufacturing method in claim 17, wherein the step (c) further comprises:
performing a first copper-plating process on a hole wall of the enhanced hole to form a first enhanced conductive layer.

19. The manufacturing method in claim 18, wherein the step (d) further comprises:
performing a second copper-plating process on a surface of the first enhanced conductive layer to form a second enhanced conductive layer; wherein the first enhanced conductive layer and the second enhanced conductive layer form an enhanced conductive layer.

20. The manufacturing method in claim 19, wherein the step (e) further comprises:
the enhanced conductive layer, and the electrode portions formed on the top surface and the bottom surface of the substrate after etching.

\* \* \* \* \*